United States Patent
van Ginneken et al.

(10) Patent No.: US 6,496,965 B1
(45) Date of Patent: Dec. 17, 2002

(54) AUTOMATED DESIGN OF PARALLEL DRIVE STANDARD CELLS

(75) Inventors: Lukas P. P. P. van Ginneken, San Jose, CA (US); Raymond X. T. Nijssen, San Jose, CA (US); Premal Buch, Daly City, CA (US)

(73) Assignee: Magma Design Automation, Inc., Cupertino, CA (US)

( * ) Notice: Subject to any disclaimer, the term of this patent is extended or adjusted under 35 U.S.C. 154(b) by 0 days.

(21) Appl. No.: 09/399,986

(22) Filed: Sep. 20, 1999

(51) Int. Cl.⁷ ................................................. G06F 17/50
(52) U.S. Cl. .................... 716/10; 716/6; 716/13; 716/17
(58) Field of Search ................. 716/1, 2, 4, 5, 716/6, 10, 8, 9, 11, 12, 13, 14, 17

(56) References Cited

U.S. PATENT DOCUMENTS

| | | | | |
|---|---|---|---|---|
| 5,416,718 A | * | 5/1995 | Yamazaki | .................. 364/488 |
| 5,654,898 A | * | 8/1997 | Roetcisoender et al. | .... 364/490 |
| 5,764,533 A | * | 6/1998 | deDood | ...................... 364/491 |

* cited by examiner

*Primary Examiner*—Matthew Smith
*Assistant Examiner*—Leigh Marie Garbowski
(74) *Attorney, Agent, or Firm*—Blakely, Sokoloff, Taylor & Zafman LLP

(57) ABSTRACT

Methods and apparatuses for automated design of parallel drive standard cells are disclosed. The capacitive load to be driven by a particular output of a standard cell is determined. The driving capacity of the output is also determined. Based on the capacitive load to be driven and the driving capacity, a number of standard cells to be used is determined. The multiple standard cells are coupled in parallel having the respective outputs coupled to the capacitive load to be driven. In one embodiment, the standard cells coupled is parallel are placed such that the connection between the respective outputs and the load are substantially equal.

17 Claims, 4 Drawing Sheets

AUTOMATED DESIGN OF PARALLEL DRIVE STANDARD CELLS

FIELD OF THE INVENTION

This invention relates generally to the field of design automation of integrated circuits, and more specifically to the field of performance optimization of digital integrated circuits.

BACKGROUND OF THE INVENTION

In the field of integrated circuit design, computers are used to automate the design process. Current integrated circuit designs have become so complex that the design process cannot be completed without the aid of computers executing design automation software. Typically, during most of the design process, the integrated circuit design exists only in the form of electronic data, stored in the memory of a computer or some other storage medium.

Integrated circuit design includes several steps. The designer creates the design by specifying the function of the design, typically by composing existing or new electronic components (or cells) having various functions. While some components (or cells) are custom designed specifically for a particular chip, most components are standard and are designed in advance and kept in one or more libraries. The designer creates the desired function by interconnecting, with nets, selected cells. Logic synthesis software aids the designer by performing some of the laborious and repetitive tasks of selection, interconnection and optimization of selected cells from the cell library. The resulting design is represented as a net list that defines the collection of cells and interconnections between the cells.

In a subsequent part of the design process, called the physical design, a set of photographic masks are created for use in manufacturing of a chip. To this end, the cells are placed on the chip area and the interconnections between the cells are routed. Physical design automation software automatically places the cells and routes the connections. Larger cells (or blocks) are usually placed at the periphery of the chip. Most of the cells are small standard cells which have a rectangular shape and a uniform height. These standard cells are typically placed in rows of the same uniform height.

Placer software is used to physically place the cells in the chip layout. For the interconnections between the cells, a number of metal layers, usually between 2 and 7, are available. Routing software is used to construct the interconnection with a variety of rectilinear metal shapes. The physical design ends with the generation of photographic masks describing the layers of the integrated circuit design.

One measure of the performance of a chip is determined by the time required to propagate the signals from register to register. Clock signal control the storing of data into these registers. The number of levels of cells that the signals propagate through and the delay of each of these cells and their interconnections determine the speed of propagation of signals. The number of levels of cells can be reduced during logic synthesis.

Capacitive, resistive and inductive effects cause a delay of the interconnections. For example, as capacitance and resistance increase with the length of an interconnection, the placement of the cells influences the performance of the chip. The capacitance that a cell needs to drive is the sum of the capacitance of the net and the capacitance of the inputs of the other cells connected to that net. If a cell drives a larger capacitance, the delay increases. Using larger transistors, this larger capacitance can be driven with the same delay. That is, the larger transistors can drive larger loads (with the same delay). However, such larger transistors cause the input capacitances of these cells to be larger, thereby slowing down the previous stage in the net list.

A variety of techniques are used for performance optimization in the design of digital integrated circuits. Because the length of the nets is important for the performance, there are placement methods that attempt to optimize the performance, generally referred to as timing driven placement schemes. One such scheme is disclosed is U.S. Pat. No. 5,218,551, entitled "Timing Driven Placement," issued Jun. 8, 1993 in which an attempt is made to place the cells on the chip in such a manner that the nets that limit the performance of the chip to the greatest extent remain as short as possible.

Other methods for optimizing the performance of a chip design are based on the sizing of the transistors. One such method is disclosed in U.S. Pat. No. 5,880,967, entitled "Minimization of Circuit Delay and Power Through Transistor Sizing," issued Mar. 9, 1999. Such methods assume that each transistor can be given an accurate individual size. These methods generally use numerical continuous multiple variable optimization algorithms. While this can lead to very accurate optimization, the wide variety of possible transistor sizes requires many custom cell designs, which can make the design very costly. Most libraries contain few versions (typically 3 or 4) of the same cell, each with different transistor sizes, potentially in parallel within an individual cell. Hence sizing algorithms have been developed that select the best drive strength from the limited available standard drive strengths. An example of one such sizing algorithm is described in U.S. Pat. No. 5,633,805, entitled "Logic Synthesis Having Two-Dimensional Sizing Progression for Selecting Gates from Cell Libraries," issued May 27, 1997.

Other methods for performance optimization are based on the insertion of amplifying standard cells, or buffers. These buffers can drive a large load while presenting a small load at their input. Buffers do not effect the logic function. An example of a buffering algorithm is described in U.S. Pat. No. 5,799,170, entitled "Simplified Buffer Manipulation Using Standard Repowering Function," issued Aug. 29, 1998. Buffering is area efficient in the sense that little cell area is required to drive a large load. Compared to transistor sizing though, an extra stage of logic is added, and sizing cannot entirely eliminate the intrinsic delay of this stage.

Another set of methods for performance optimization in digital IC design is based on duplicating standard cells with multiple fanouts. The capacitance of all the pins of the output net is then distributed among the original cell and the duplicate cells, each of the cells driving a disjunct subset of the fanouts. This technique is known as "cloning." U.S. Pat. No. 5,396,435, entitled "Automated Circuit Design System and Method for Reducing Critical Path Delay Times," issued Mar. 7, 1999, describes, among other things, one such cloning method.

However, cloning has several limitations including potential difficulty finding an acceptable balance when partitioning fanouts; cloning cannot be used to drive single fanouts with large capacitances (such as primary outputs); cloning cannot be used to drive large capacitances due to long wires; cloning cannot be used for standard cells with bidirectional pins; and cloning cannot easily be used for multi-source nets.

Therefore, what is needed is a scheme for automatically generating circuit designs capable of driving large loads in such a manner as to avoid one or more of the problems or limitations in the art described above.

SUMMARY OF THE INVENTION

Methods and apparatuses for automated design of parallel drive standard cells are disclosed. A standard cell having insufficient drive strength to drive a load is identified. The standard cell is duplicated one or more times to provide a set of multiple standard cells having sufficient combined drive strength to drive the load. The set of standard cells are coupled in parallel to drive the load. In one embodiment, the set of standard cells are aligned vertically or horizontally on the integrated circuit to provide a stacked set of standard cells.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
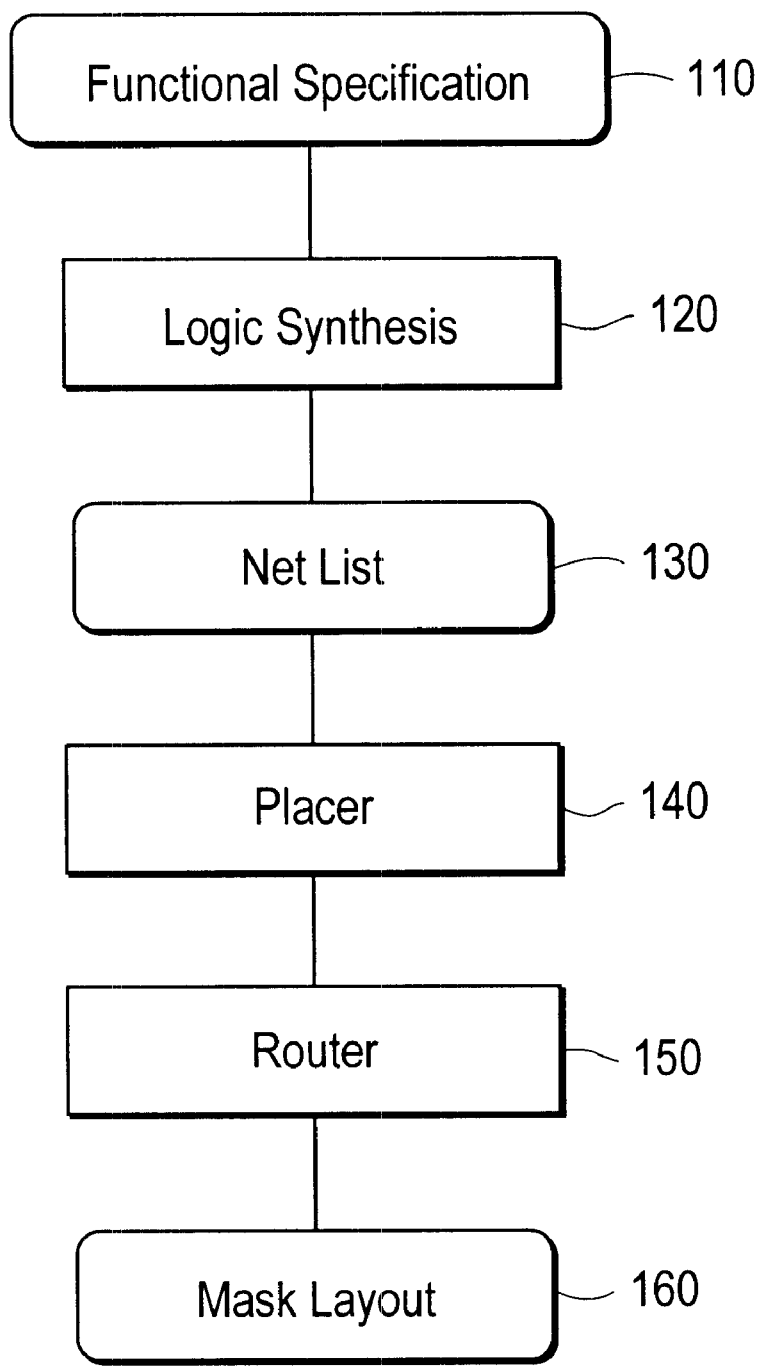
FIG. 1 illustrates a flow chart of one embodiment of an integrated circuit design process.

Methods and apparatuses for automated design of parallel drive standard cells are disclosed. In the following description, numerous details are set forth, such as distances between components, types of modeling, etc. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

Overview

Multiple cells are coupled in parallel in order to drive a load that a single standard cell cannot drive by itself and/or where one or more cells are too strong by themselves. Thus, a cell may be inadequate or insufficient. By being in parallel, the cells share the same inputs, while their outputs are all coupled together to drive the load. This technique of coupling together multiple cells in parallel compensates for situations, such as, for example, where the largest drive strength for a typical standard cell in the library usually is less than that which is necessary for the length of a long wire. This technique also avoids adding one or more buffers, which can result in an unacceptable delay or a delay that is larger than the delay of a properly sized standard cell.

Methods and apparatuses for automated design of parallel drive cells are disclosed. In one embodiment, the capacitive load to be driven by a particular output of a cell is determined. The driving capacity of the output is also determined. Based on the capacitive load to be driven and the driving capacity, a number of cells to be used is determined. The cells may be the same or different cells. The multiple cells are coupled in parallel having the respective outputs coupled together to drive the capacitive load. In one embodiment, the coupling of the parallel cells are part of a single net. In one embodiment, the cells coupled in parallel are placed such that the connection between the respective outputs and the load are substantially equal.

The cells that may be coupled in parallel include cells with tri-state or bidirectional pins (which is not the case with cloning).

FIG. 1 illustrates a flow chart of an integrated circuit (IC) design process. The process performed by processing logic which may comprise hardware, software or a combination of both. Referring to FIG. 1, processing logic initially creates functional specification (processing block 110). The functional specification is a functional, but not necessarily a physical, description of the circuit being designed. In one embodiment a high-level description language (HDL), such as, for example, VHDL and Verilog® commonly used to design circuits, may be used to create the functional specification. One embodiment of VHDL is described in greater detail in "IEEE Standard VHDL Language Reference Manual," ANSI Std. 1076–1993, published Jun. 6, 1994. One embodiment of Verilog® is described in greater detail in "IEEE Standard Hardware Description Language Based on the Verilog® Hardware Description Language," IEEE Standard 1364–1995, published Oct. 14, 1996. These high-level IC description languages allow a circuit designer to design and simulate circuits by using high-level code to describe the structure and/or behavior of the circuit being designed.

Using the high-level IC description language code, processing logic performs logic synthesis (processing block 120) to produce net list (processing block 130) that describes an interconnection of circuit components to provide desired functionality. In one embodiment, during logic synthesis, processing logic determines that the available standard cells have insufficient drive strength individually to drive the load(s) that is to be coupled thereto in the design. To overcome this limitation, standard cells are duplicated and multiple standard cells are coupled in parallel to drive the load. In one embodiment, the capacitance of the load is divided by the driving capacity of the standard cell to determine the number of standard cells to couple in parallel to drive the load. Alternatively, other methods can be used. In alternative embodiments, identification and duplication of standard cells is performed in a different stage of IC circuit design, such as, for example, shown in FIG. 7.

Figure 2:
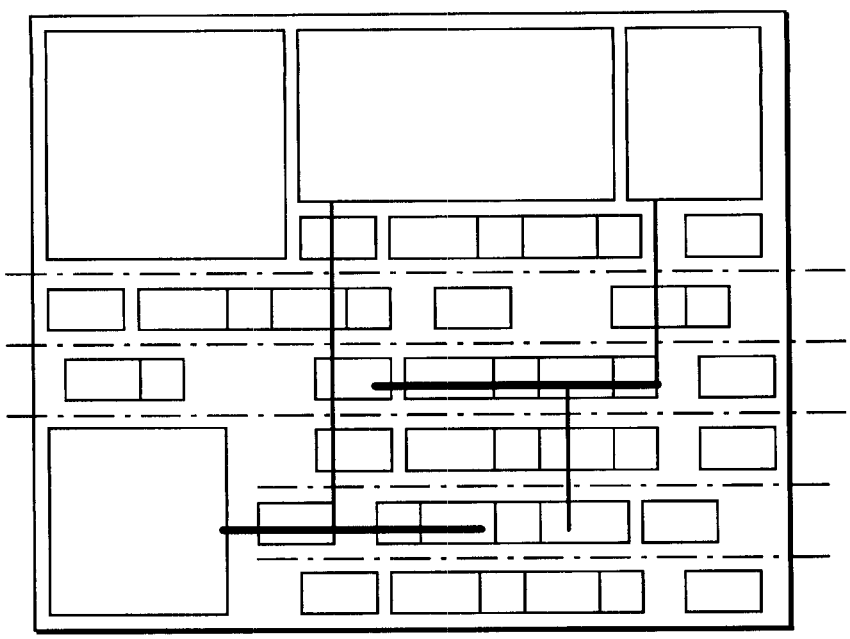
FIG. 2 illustrates an exemplary integrated circuit having large blocks and rows of standard cells.

Processing logic operates as a placer to determine a physical location for various cells within the boundaries of the IC being designed (processing block 140). FIG. 2 illustrates an integrated circuit having large blocks and rows of standard cells. The placer operates to position these large blocks and rows of standard cells. Then, processing logic operates as a router to determine the placement of interconnections between the various cell elements within the boundaries of the IC being designed (processing block 140). In one embodiment, the processing logic operates as a placer identify and duplicate standard cells to be placed (processing block 150) and as a router to couple the standard cells in parallel (processing block 160).

Using the net list and the results of the placement and routing, processing logic develops a mask layout (processing logic 160) to ultimately fabricate an IC having the functionality of the designed circuit. The net list can also be used for verification purposes.

In one embodiment, the results of the logic synthesis is the specification of parallel drive cells as described in greater detail below. In alternative embodiments, other devices and/or components provide the parallel drive standard cells.

Figure 3:
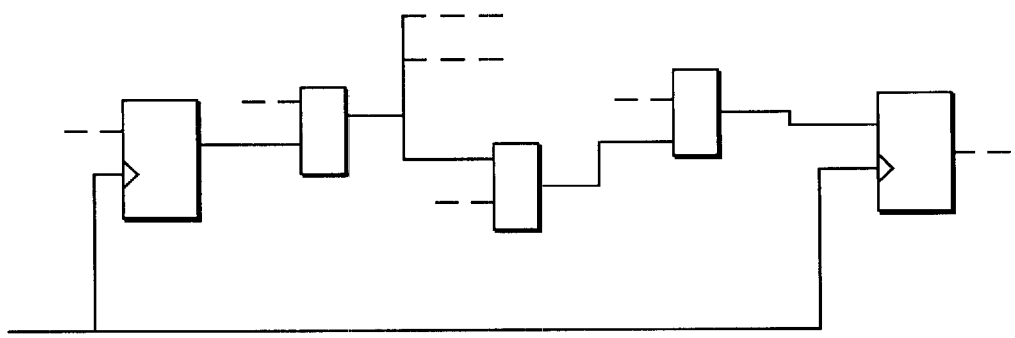
FIG. 3 illustrates a block diagram of a net list comprising registers and logic cells.
Figure 4:
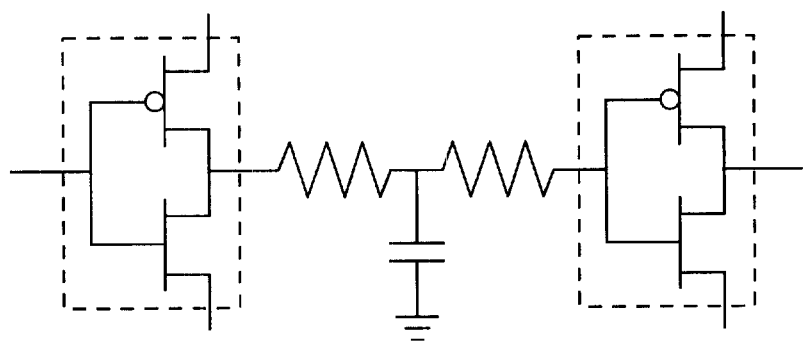
FIG. 4 illustrates an RC delay and parasitic and transistor sizing.

FIG. 3 illustrates a net list comprising of registers and logic cells including illustrating signal propagation through a design during the clock cycle. Referring to FIG. 3, dashed lines are included to indicate additional elements have not been shown to avoid obscuring the invention. FIG. 4 illustrates a circuit schematic representation of a cell in which two inverters are coupled using an RC circuit having an associated delay. Such cells have an RC delay and are subject to parasitic delays.

Figure 5:
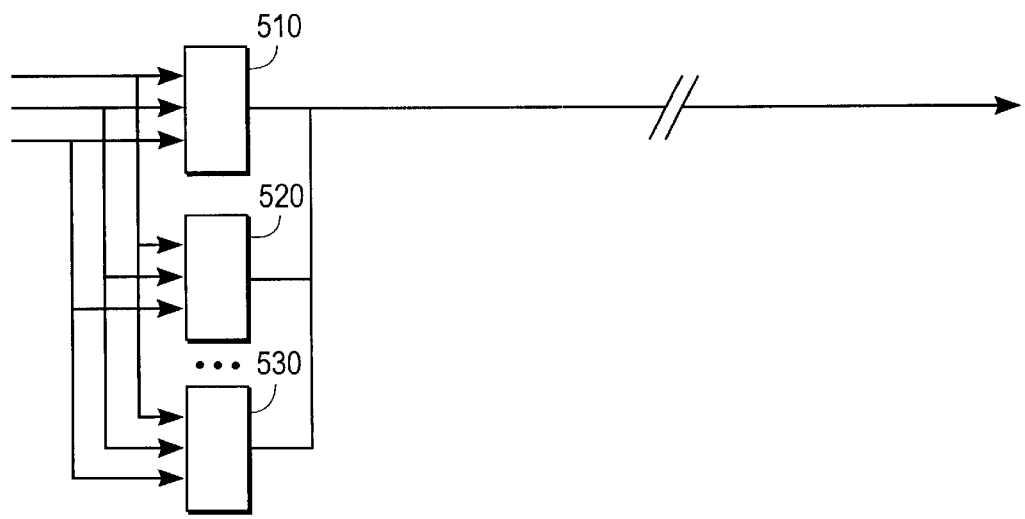
FIG. 5 is a schematic circuit diagram of one embodiment of a set of parallel standard cells to drive a long wire.

FIG. 5 illustrates a schematic circuit diagram of set parallel standard cells to drive a long wire. Referring to FIG. 5, multiple standard cells (e.g., 510, 520, 530) are coupled in parallel to receive one or more of the same input signals and to drive a single output line. Any number of inputs and outputs may be supported.

A timing engine that can analyze the slack of a pin in the net list may be used in placing the set of parallel standard cells. The slack on a pin is the difference between the actual arrival time of the signal and the required time of the signal. In one embodiment, the arrival time of a signal is the departure time of the signal at a register or at a primary input of the net list plus the sum of the delays of the standard cells along a path in the net list, while the required time of a signal is the required time of the signal at a register input or a primary output of the net list minus the sum of the delays of the cells along the path. The timing engine is able to calculate the arrival times, required times, and slack of the any signal in the net list.

The delay of each of the cell is a function of the capacitance that the cell drives, the input transition time at the input of the standard cell, the temperature, the power supply voltage and possibly other process parameters. If placement is not performed yet, the capacitance of the nets is estimated, based on the fanout of the net. When identical cells are placed in parallel, the delay of the cells is calculated by dividing the capacitance by the number of drivers.

If the parallel cells are not identical, the delay is more difficult to determine because it is not clear how much load each of the cells is driving. Each of the cells have a delay equation $d(C\_o, s\_i, p\_e)$, where d is the delay function from the delay between an input and an output pin, $C\_o$ is the output capacitance that the output drives, $s\_i$ is the input slew or transition time and $p\_e$ are a set of environmental parameters, such as, among others, temperature and power supply voltage.

Our method for modeling the delay of unequal parallel cells is to set the delays of the n parallel cells equal ($d\_1 = d\_2 \ldots = d\_n$) and solve for the loads of the cells. Each of the 1 ... n parallel cells drives a fraction $C\_I$ of the total output capacitance $C\_o$.

The fractions have to add up to the total capacitance:

$$C\_1 + C\_2 + \ldots + C\_n = C\_o.$$

It is equivalent to solving the following equations $$d\_1 = d(C\_1, s\_1, p\_e)$$

$$d\_2 = d(C\_2, s\_2, p\_e) \ldots$$

$$d\_n = d(C\_n, s\_n, p\_e)$$

$$C\_1 + C\_2 + \ldots + C\_n = C\text{---}o$$

$$d\_1 = d\_2 = \ldots = d\_n$$

A positive slack indicates that the signal arrives earlier then required, and a negative slack indicates that the signal arrives later then required.

The timing engine is used to determine the critical path in the net list. The critical path is traversed to identify cells which can benefit from a parallel cell structure. The net list is traversed in the opposite direction of the signal flow. For each cell, the encountered slack on each of the output pins is calculated by the timing engine. Then, one or more duplicates of the cell is coupled in parallel with the original cell.

Because the multiple cells are coupled in parallel to drive a common output, additional buffers coupled between the output of the standard cells and the load to be driven are not necessary to drive the load. In one embodiment, the multiple parallel cells are "stacked" such that physical distance an output signal travels from each cell to the load is substantially equal (or at least close). Stacking the cells results in pin alignment between the cells. The cells may be stacked horizontally or vertically. Note that stacking doesn't require that the cells be oriented the same way. For example, two cells stacked on each other may have orientations which are mirror images of each other.

Stacking the cells may eliminate or reduce timing hazards that may cause a short circuit condition. For instance, if in a case where inputs to a cell occur at different times due to different lengths, a short circuit may be created where a pull up transistor and a pull down transistor are activated at the same time causing current flow. Placing cells in a regular stack pattern also facilitates routing and reduces routing congestion.

In an alternative embodiment, the physical connection between one or more of the cells and the load is artificially lengthened such that the physical distance an output signal travels from each cell to the load is substantially equal. Stacking parallel cells also allows the cells to use multiple power rails (which normally run horizontally), thus ensuring more even distribution of the large currents that the cells use. Thus, vertical stacking may be preferred over horizontal stacking.

Figure 6:
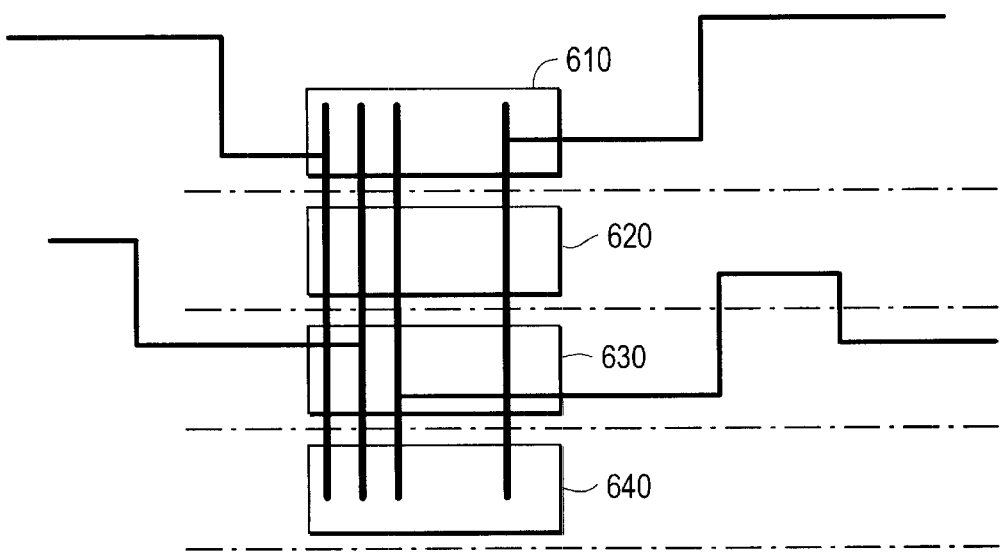
FIG. 6 illustrates the placement of parallel standard cells in one or more stacks.

FIG. 6 illustrates the placement of parallel standard cells in one or more stacks. The cells 610, 620, 630, 640 of FIG. 6 are generated and placed in a similar manner as the cells of FIG. 5. However, the outputs of the standard cells of FIG. 6 drive one or more loads (e.g., other cells, output pins, wires, etc. that are located in close proximity to the standard cells. Two inputs and two outputs are shown in the arrangement of the four cells. Any number of inputs and outputs may be used depending on the application of the structure.

Figure 7:
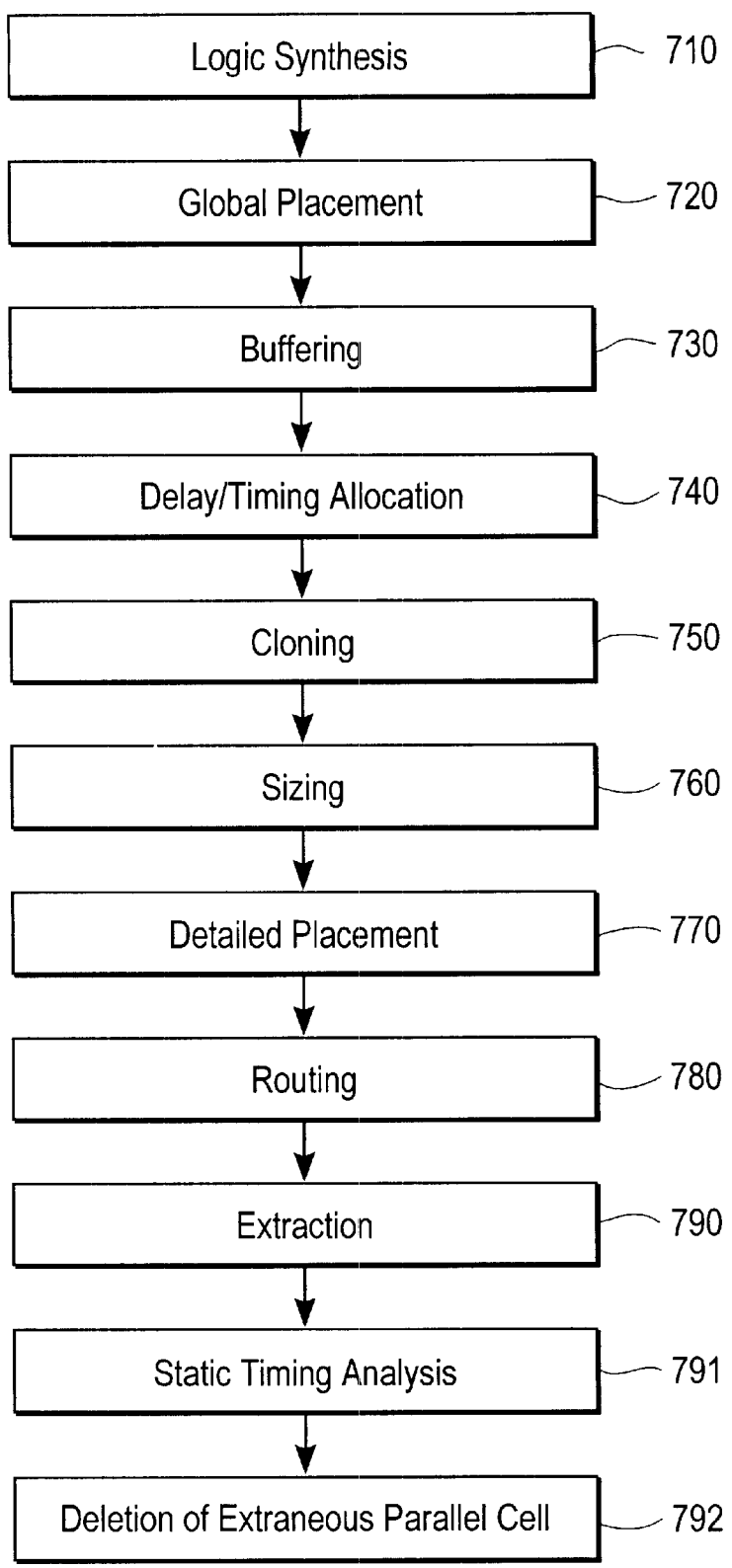
FIG. 7 is a flow chart of one embodiment of an integrated circuit design automation that automatically provides multiple parallel standard cells.

FIG. 7 is a flow chart of the integrated circuit design automation that automatically provides multiple parallel cells. Each of the operations may be performed by processing logic, which may comprise hardware, software, or a combination of both. Referring to FIG. 7, logic synthesis 710 operates on a functional description of an IC design. Logic synthesis 710 generates a net list describing the components and interconnections of the IC design.

Global placement 720 is performed, for example, by routing software to place the components of the IC design within the physical boundaries of the IC to be manufactured. In one embodiment, global placement 720 generates and places multiple parallel standard cells to drive loads that otherwise could not be driven by a single standard cell without one or more buffers or other signal strengthening components. In alternative embodiments, generation and/or placement of parallel standard cells is accomplished in another stage of design automation.

Buffering 730 generates and/or places buffers where necessary to strengthen, or boost, output signals. In one embodiment, buffering is provided for standard cells of the IC design and subsequent design procedures, for example, by placement and/or routing software, automatically replace a standard cell and a signal strengthening buffer with a set of parallel standard cells.

Delay/timing allocation 740 optimizes the net list generated by logic synthesis 710, where possible. Cloning 750 is performed, for example, as described above where the capacitance of all the pins of the output net is then distributed among the original cell and the duplicate cells, each of the cells driving a subset of the fanouts.

Sizing 760 determines the appropriate size of the transistors of the IC design to provide sufficient current to drive the capacitive loads to which the transistors are coupled and to provide the appropriate timing characteristics.

Detailed placement 770 provides additional placement adjustments to blocks and cells of the IC design. In one embodiment, detailed placement is used to automatically attempts to stack the parallel cells together. In one embodiment, standard parallel cells are used as a single cell and an attempt is made to fit this new cell into a location in the IC design. Depending on the result, additional adjustments may be to be made to the placement (e.g., the stacking). Routing 780 routes interconnections between the blocks and cells of the IC design, which is dependent on the locations of the parallel cells.

To ensure timing closure of the final layout, the capacitance estimates during the placement process (steps 720 to 760) are conservative. That means that the estimates are larger than the likely actual capacitances. As a result, larger drive strengths are selected and more parallel cells are used.

After final routing, detailed extraction of the actual capacitance and resistance values is performed (processing block 790). The extracted values of the capacitance and resistance of the nets are used to perform a static timing analysis (processing block 791).

Due to the conservative estimates which were used to perform paralleling of cells, the timing is now often better (faster) than required. At this point, some of the parallel cells turn out to be unnecessary. Such parallel cells can be removed from the layout (processing block 792), even after the final routing has been completed. Since no additional connections are required to be made, both routing completion and timing closure remain guaranteed.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

Thus, automated design of parallel drive standard cells has been described.

What is claimed is:

1. An integrated circuit design method comprising:
   identifying a first cell having one or more inputs and inadequate drive strength to drive a load;
   identifying a set of cells having sufficient combined drive strength to drive the load; and
   automatically setting inputs of each of the set of cells to receive the one or more inputs and setting outputs of the set of cells to be combined together so that, after routing, the set of cells are in parallel to drive the load in place of the first cell driving the load.

2. The method of claim 1, wherein identifying a first cell having one or more inputs and inadequate drive strength comprises comparing an actual capacitive load that the first cell is to drive and a typical capacitive load of the first cell.

3. The method of claim 1, wherein the number of cells in the set of cells is determined based, at least in part, by a ratio of an actual capacitive load of the first cell and a typical capacitive load of the first cell.

4. The method of claim 1, wherein identifying a first cell having one or more inputs and inadequate drive strength comprises comparing a signal propagation delay of the first cell and a signal propagation delay of the first cell with one or more additional parallel cells.

5. The method of claim 1, wherein the set of cells is arranged in one or more stacks.

6. The method of claim 5 wherein pins of the cells in the stack are aligned.

7. The method defined in claim 5 further comprising:
performing extraction;
performing timing analysis; and
deleting extraneous one or more parallel cells after routing the interconnections between cells.

8. An apparatus for designing integrated circuits comprising:
means for identifying a first cell having one or more inputs and inadequate drive strength to drive a load;
means for identifying a set of cells having sufficient combined drive strength to drive the load; and
means for automatically setting inputs of each of the set of cells to receive the one or more inputs and setting outputs of the set of cells to be combined together so that, after routing, the set of cells are in parallel to drive the load in place of the first cell driving the load.

9. The apparatus of claim 8, wherein the means for identifying a first cell having one or more inputs and inadequate drive strength comprises means for comparing an actual capacitive load that the first cell drives and a typical capacitive load of the first cell.

10. The apparatus of claim 8, wherein the number of cells in the set of cells is determined based, at least in part, by a ratio of an actual capacitive load of the first cell and a typical capacitive load of the first cell.

11. The apparatus of claim 8, wherein the means for identifying a first cell having one or more inputs and inadequate drive strength comprises means for comparing a signal propagation delay of the first cell and a signal propagation delay of the first cell with one or more additional parallel duplicates.

12. The apparatus of claim 8, wherein the set of cells is arranged in one or more stacks.

13. A machine readable medium having stored thereon sequences of instructions to implement a design automation tool, wherein the sequences of instructions, when executed by one or more processors, cause a system to:
identify a first cell having one or more inputs and inadequate drive strength to drive a load;
identify a set of cells having sufficient combined drive strength to drive the load; and
automatically setting inputs of each of the set of cells to receive the one or more inputs and setting outputs of the set of cells to be combined together so that, after routing, the set of cells are in parallel to drive the load in place of the first cell driving load.

14. The machine readable medium of claim 13, wherein the sequences of instructions that cause the system to identify a first cell having one or more inputs and inadequate drive strength further comprises sequences of instructions that cause the system to compare an actual capacitive load that the first cell drives and a typical capacitive load of the first cell.

15. The machine readable medium of claim 13, wherein the number of cells in the set of cells is determined based, at least in part, by a ratio of an actual capacitive load of the first cell and a typical capacitive load of the first cell.

16. The machine readable medium of claim 13, wherein the sequences of instructions that cause the system to identify a first cell having one or more inputs and inadequate drive strength further comprises sequences of instructions that cause the system to compare a signal propagation delay of the first cell and a signal propagation delay of the first cell with one or more additional parallel cells.

17. The machine readable medium of claim 13, wherein the set of cells is arranged in one or more stacks.

* * * * *